United States Patent [19]
Swirbel et al.

[11] Patent Number: 6,091,194
[45] Date of Patent: Jul. 18, 2000

[54] ACTIVE MATRIX DISPLAY

[75] Inventors: Thomas J. Swirbel, Davie; Patrick M. Dunn, Coral Springs, both of Fla.

[73] Assignee: Motorola, Inc., Schaumburg, Ill.

[21] Appl. No.: 08/926,627

[22] Filed: Sep. 10, 1997

Related U.S. Application Data

[63] Continuation of application No. 08/561,538, Nov. 22, 1995, abandoned.

[51] Int. Cl.[7] .................................................. H05B 33/14
[52] U.S. Cl. ......................... 313/498; 313/506; 313/505; 313/500; 345/80; 345/206; 345/76
[58] Field of Search ................................ 345/80, 90, 206, 345/36, 45, 55, 76; 317/498, 500, 505, 506

[56] References Cited

U.S. PATENT DOCUMENTS

| | | | |
|---|---|---|---|
| 2,922,076 | 1/1960 | Sack, Jr. et al. | 345/206 |
| 2,969,481 | 1/1961 | Sack, Jr. | 345/80 |
| 3,512,041 | 5/1970 | Dalmasso | 345/80 |
| 4,839,558 | 6/1989 | Mierzwinski | 345/80 |
| 4,924,144 | 5/1990 | Menn et al. | 313/504 |
| 5,125,111 | 6/1992 | Trinh | 455/327 |
| 5,276,380 | 1/1994 | Tang | 313/504 |
| 5,284,287 | 2/1994 | Wilson et al. | 228/180 |
| 5,294,869 | 3/1994 | Tang et al. | 313/504 |
| 5,294,870 | 3/1994 | Tang et al. | 313/504 |
| 5,302,468 | 4/1994 | Namiki et al. | 428/690 |
| 5,444,022 | 8/1995 | Gardner | 437/195 |
| 5,485,038 | 1/1996 | Licari et al. | 257/758 |

*Primary Examiner*—Ashok Patel
*Attorney, Agent, or Firm*—Dale W. Dorinski

[57] ABSTRACT

A flat panel display (10) uses active matrix addressing. Two parallel substrates (20, 30) have an organic electroluminescent medium (40) that emits visible light in response to an electrical signal, sandwiched between them. The top substrate is transparent to allow emitted light (50) to be discernible to an observer. The bottom substrate does not need to be transparent, as the active matrix display operates in a emissive or reflective mode. An array of electrodes (22) is situated on an inside face of the bottom substrate, and a transparent electrode (32) corresponding to the array is situated on an inside face of the top substrate. The electrodes serve to define an array of pixels. A number of switches (24) are located on the backside of the bottom substrate, and are each connected to respective electrodes (22) by an electrically conductive via (28) in the bottom substrate.

12 Claims, 4 Drawing Sheets

ACTIVE MATRIX DISPLAY

This is a continuation of application Ser. No. 08/561,538, filed Nov. 22, 1995, and now abandoned.

TECHNICAL FIELD

This invention relates in general to flat panel displays and more specifically to displays containing an organic electroluminescent medium.

BACKGROUND

Flat panel displays have become commonplace and are used in nearly every electronic device today. The need to process and provide information to the user in a compact and highly reliable manner has driven most of the research and development in flat panel displays. A wide variety of display technologies exist, many of which originated between 1960 and 1980. Some commercially important flat panel displays are the light emitting diode (LED) display, plasma display (PDP), electroluminescent (EL) display, vacuum fluorescent display (VFD), and liquid crystal display (LCD). While the LED enjoyed early success, the LCD has overtaken the LED as the device of choice in nearly all electronic apparatus, particularly in communication devices.

Dot matrix LCD's utilize a technique known as active matrix addressing or direct addressing. Rather than multiplexing the timing of the signals to select and write to particular lines of the display, the addressing function is separated from the writing function, thus each line can be written more quickly. As more and more lines are written, the amount of time the controller or display driver can spend writing to each individual line or pixel (the duty cycle) decreases. Eventually, the molecules of the liquid crystal do not have time to react to fully react to the applied voltage, and image quality diminishes. Large dot matrix displays that are not actively addressed exhibit slow speed, high power consumption, and complex circuitry. The technique of active matrix addressing makes the display hardware more complex by adding a switch to each pixel. The switch can then be turned on very rapidly (in a few microseconds) and a storage capacitor can then be used to maintain its condition while the other lines are being written. Several approaches to making individual switches have been investigated, and these include diodes, varistors, transistors and various combinations thereof. The thin film transistor (TFT) approach has emerged as the most successful technique for active matrix addressing in terms of display performance. This structure utilizes a thin film transistor and capacitor applied directly to the display substrate. Obviously this places severe requirements on both the hardware and processing conditions needed to fabricate the display. A semiconductor material must be incorporated into the substrate in order to fabricate the thin film transistor, with polysilicon or amorphous silicon the two techniques of choice to create the semiconductor material for the transistor. Since this approach essentially requires that the transistor be located in close proximity to each pixel, the substrate for the display must be fabricated in the same manner as semiconductor wafers, thus incorporating significant cost and yield penalties in making the substrates. While displays used for small screen televisions that typically measure 3 to 6 inches (diagonal) can be made using this technology, clearly anything above 10 inches becomes cost-prohibitive or impossible to fabricate.

Another type of display, the EL, utilizes a mechanical structure similar to the LCD, but instead of using a liquid crystal fluid as the image forming medium, an electroluminescent material is substituted. When the voltage is applied to the EL material, it is energized and then decays to emit a photon and thus creates light in the visible spectrum. Typical EL displays utilize an inorganic electroluminescent material such as zinc sulfide that is doped with manganese or other ions. Examples of these types of EL displays may be found in U.S. Pat. No. 4,924,144 which is incorporated herein by reference. EL displays suffer from the same limitations that LCD's do; namely the need to provide high speed accessing of the individual pixels in large dot matrix applications. While EL panels can be switched at a higher rate than LCD's, thus making them more attractive for large flat screen displays, the inherent problems of making large displays still remain. Clearly, it would be desirable and a significant step in the art if a technique to make a cost effective, high speed, large, flat panel display could be provided.

DETAILED DESCRIPTION OF THE PREFERRED EMBODIMENT

Figure 1:
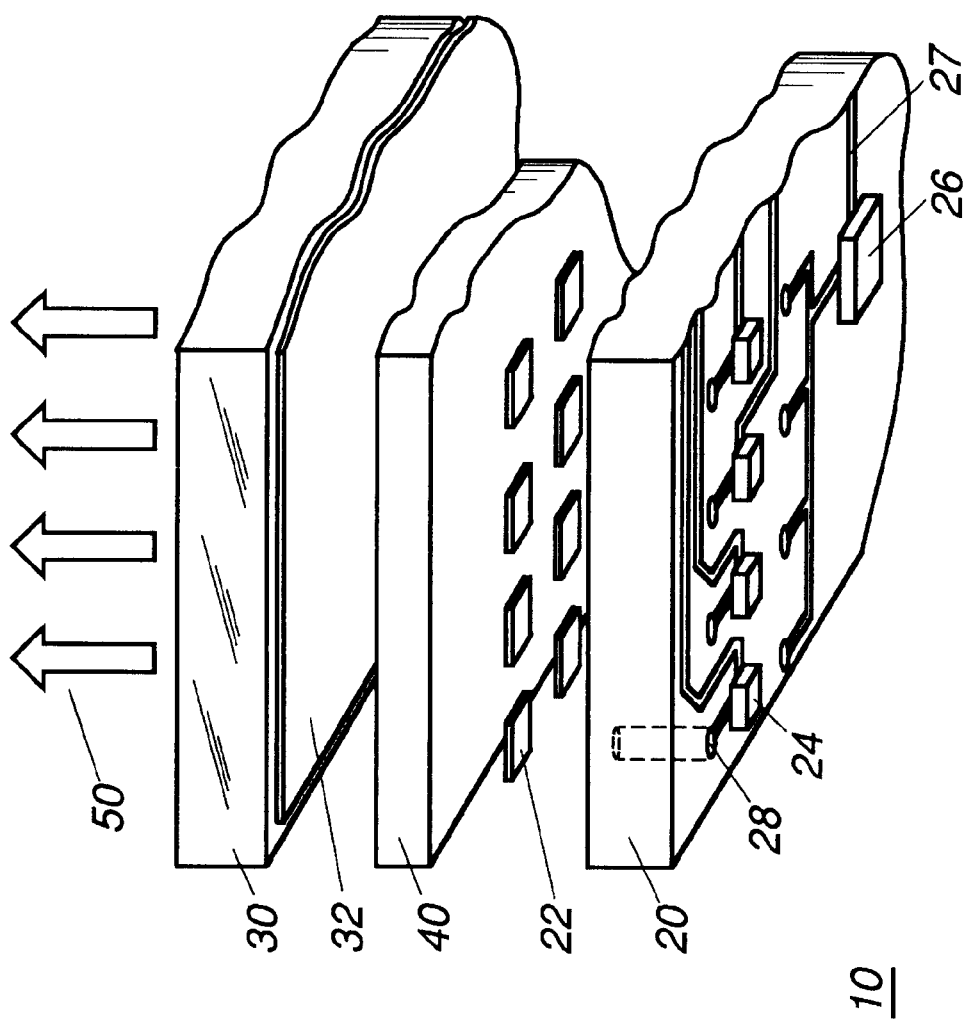
FIG. 1 is an exploded view of an active matrix display in accordance with the invention.

While the specification concludes with claims defining the features of the invention that are regarded as novel, it is believed that the invention will be better understood from a consideration of the following description in conjunction with the drawing figures, in which like reference numerals are carried forward. Referring now to FIG. 1, a flat panel display 10 that uses active matrix addressing technology has two parallel substrates 20, 30. Sandwiched between the two substrates is an organic electroluminescent medium 40 that emits visible light in response to an electrical signal. The top substrate 30 of the active matrix display is transparent in order to allow emitted light 50 to be discernible to an observer. However, the bottom substrate 20 does not need to be transparent, as the active matrix display operates in a emissive or reflective mode. In one embodiment, an array of electrodes 22 are situated on an inside face of the bottom substrate 20, and a transparent electrode 32 corresponding to the array 22 is situated on an inside face of the top substrate. The electrodes 22, 32 serve to define a matrix, and at each intersection of the matrix a pixel is defined. A number of switching means 24, such as transistors, diodes or varistors are located on the backside of the bottom substrate, that is on the side opposite the array of electrodes. The switching means or transistors 24 are each connected to respective individual electrodes 22 by an electrically conductive via 28 in the bottom substrate.

In the preferred embodiment, this active matrix display is an emissive organoluminescent display having pixels that are each addressed by individual transistors 24 located on the backside of the rear substrate 20. Numerous methods of creating the pixels have been demonstrated in the art, for example, those outlined by Tang et al in U.S. Pat. Nos. 5,294,869; 5,294,870; 5,276,380; and by Namiki in U.S. Pat. No. 5,302,468; all of which are incorporated herein by reference. The transistors are mounted either in transistor packs or arrays 26 (for example, multiple transistors on a single die) which are attached to the back of the substrate using bump type technology, or individual transistors may be attached at each site using flip chip techniques. Conductor paths 27 formed on the backside of the bottom substrate provide the signal link between the pixel transistor 24 and the display driver or microprocessor (not shown). The bottom substrate forms one-half of the display. Because the display is emissive or reflective, the bottom substrate does not need to be transparent, so a material such as co-fired alumina ceramic may be used in conjunction with copper or tungsten-filled vias 28 to provide the interconnect between the pixels and the transistors. In addition, organic-based printed circuit boards such as epoxy-glass, polyimide-glass, TEFLON®-glass, or liquid crystal polymers may be used. When organic printed circuit boards such as epoxy-glass are used, blind via technology and multi-layered systems are preferred. The pitch of the vias is dependent on the pixel size and the number of pixels on a display. Typically, 5 mil vias with 11 mil spaces would be preferred to provide a 10 mil pixel resolution. The current industry standard of 20 mil pixels requires a less stringent 21 mil pitch. The top side of this bottom substrate is coated with either silver, copper or aluminum (using nichrome or chrome as a glue layer) and selectively imaged to form the desired pixel pattern. Metallization may be applied using a number of techniques but is typically performed with thin film photolithography in the preferred embodiment. Each individual pixel pattern makes separate contact with each of the copper or tungsten filled vias which in turn is connected to the transistor on the backside of the substrate. In other prior art active matrix dot matrix displays, the individual pixels in the array are addressed by a complex circuitry path routed across the substrate surface, which causes significant signal delay and signal loss. Locating the switch next to the pixel eliminates the need for these long runners, and significantly improves addressing speed and reduces signal loss. The ability to connect the switching means to the pixel by a conductive via through the substrate also eliminates the need to use an expensive semiconductive substrate, thus allowing larger, cheaper displays to be made.

The top substrate 30 is a transparent material (i.e. glass or clear plastic) similar to that typically used in conventional display construction, and coated with a suitable transparent conductive coating such as the well-known indium tin oxide (ITO). The ITO layer is then patterned to form the desired conductive pattern. This pattern typically would be a ground plane 32 that essentially covers the same area that the array of pixels comprises on the bottom substrate, such that when any or all of the pixels are energized, they would create an electrical field with the ground plane. The organoluminescent layer 40 that is sandwiched between the two substrates cam be applied to either the top substrate or to the bottom substrate. In either case, one or more layers of the organoluminescent medium are typically spin coated or vacuum deposited (for example by evaporation) onto the selected substrate. A metal with an appropriate work function (such as lithium or magnesium) is also added to the sandwich. This combination provides the appropriate hole/electron transport through the medium in order to create the emission of light at selected pixels.

Figure 2:
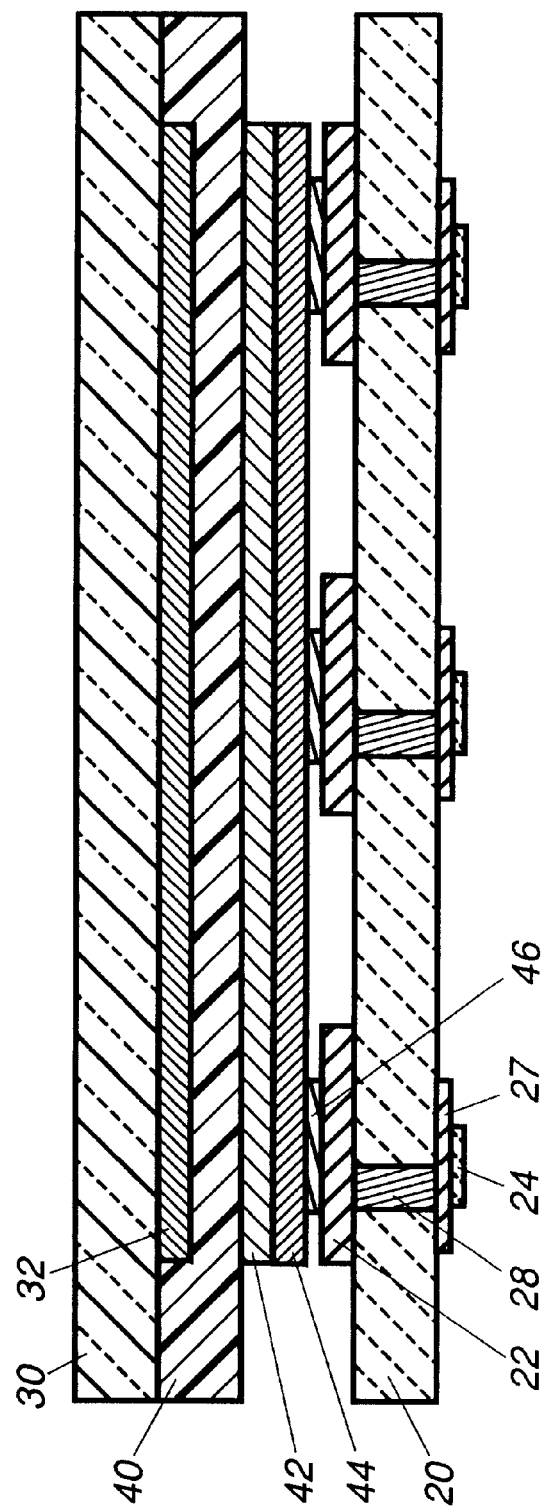
FIG. 2 is a cross-sectional view of another embodiment of an active matrix display in accordance with the invention.

Referring now to FIG. 2, another embodiment of the invention will be explained using a cross-sectional view. The top substrate 30 is a transparent material (i.e. glass) similar to that typically used in conventional systems, coated with a suitable transparent conductive coating such as indium tin oxide (ITO), patterned to form a ground plane 32. If co-fired ceramic is used as the bottom substrate 20, the conductive vias 28 are formed by conventional punching, filling and firing techniques. The upper surface of the substrate is lapped and polished after firing in order to achieve a smooth surface finish. Means for providing electrically conductive vias in substrates such as co-fired ceramic and printed circuit boards are well known to those skilled in the art and will not be further elaborated upon here. Depending on the configuration and layout of the pixels 22 and conductive vias 28, additional circuitry or circuit paths 27 may be defined on the top and/or bottom sides of the substrate 20 to connect the transistors 24 to the pixels 22. The transistors may be individual discrete components that are individually mounted near each via, or they may be a transistor array on an integrated circuit chip. Such a chip incorporates a multiplicity of transistors on a single chip, and the chip is then electrically connected to a plurality of vias such that each transistor in the array is connected to a corresponding pixel on the substrate. Means of connecting discrete transistors or transistor array chips to a substrate using controlled collapse chip connection (C4) or controlled collapse chip carrier connection (C5) technology are well known to those skilled in the art. A microprocessor or display driver (not shown) is used to control the on/off switching of the transistors and may be mounted on the back side of the substrate with the transistor array, or the driver may be remotely connected to the active matrix display in a fashion typically used in LCD panels.

Figure 3:
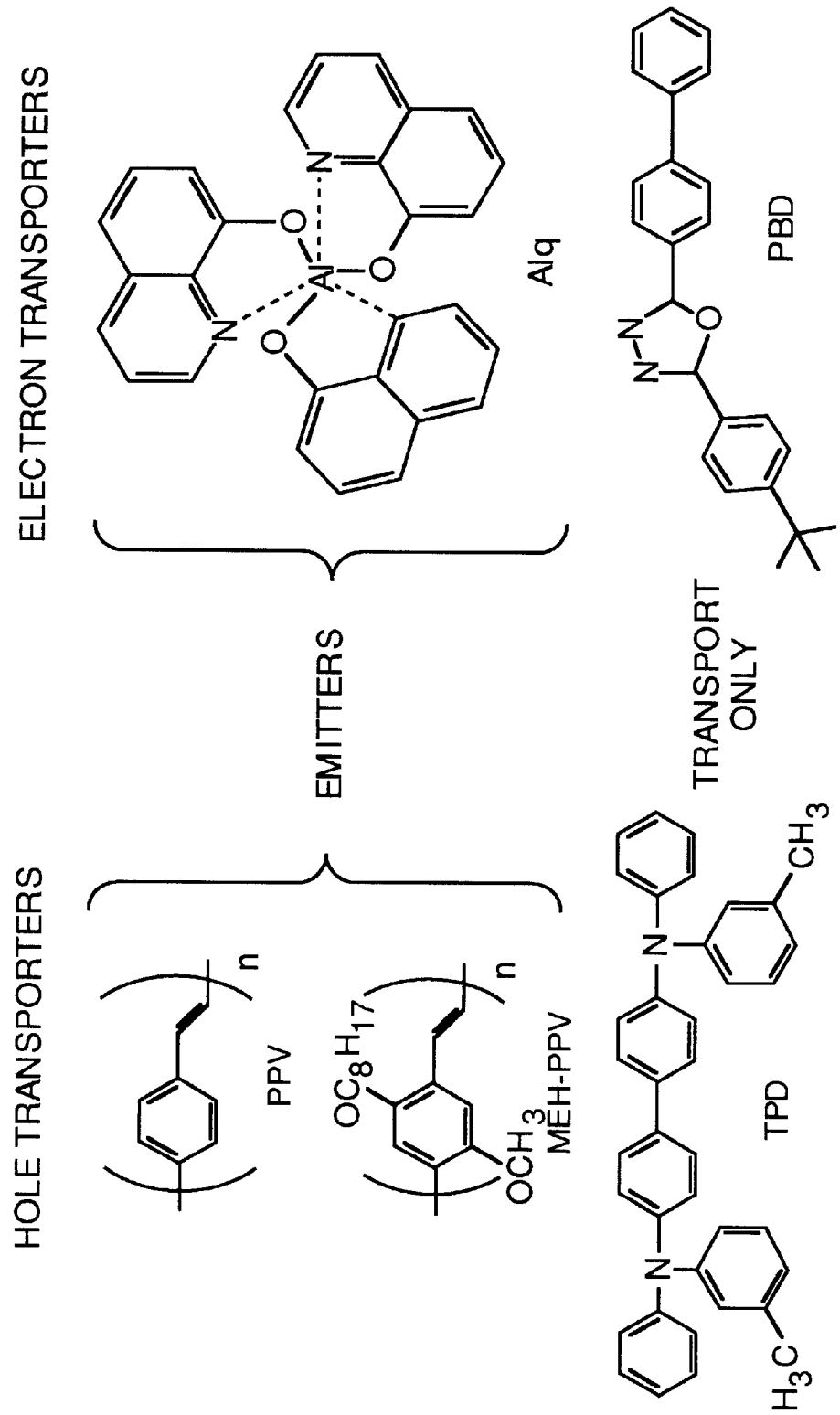
FIG. 3 shows structural formulas of organic electroluminescent materials used in an active matrix display in accordance with the invention.

One or more layers of an organoluminescent medium 40 are then coated over the ITO electrodes on the top substrate, usually by spin coating. Examples of suitable organoluminescent materials may be found in the aforementioned U.S. Patents incorporated by reference. In one embodiment, materials such as PPV, MEH-PPV, TPD and PBD shown in FIG. 3 may be used. These examples are by way of example only and not by way of limitation. Other organic electroluminescent materials having suitable properties may certainly be utilized. A thin layer 42 of lithium or magnesium is selectively vacuum deposited on the organoluminescent layer 40, and then overcoated with a thin layer 44 of aluminum or silver. Glass or plastic spacers as used in conventional LCD manufacturing may be incorporated to provide appropriate spacing between the two substrates. The two substrates are further held in place with an epoxy seal (not shown) around the perimeter of the substrates as in conventional LCD technology. When an organic circuit board is used at the bottom substrate, the substrate should be coated with a moisture barrier material such as silicon dioxide to provide maximum device reliability.

Optionally, a conductive epoxy 46 such as silver filled epoxy may be screen printed or dispensed on each pixel 22 on the bottom substrate prior to assembly, and the two substrates aligned and assembled such that the conductive epoxy provides electrical contact between the pixel and the metal layers 42, 44.

Figure 4:
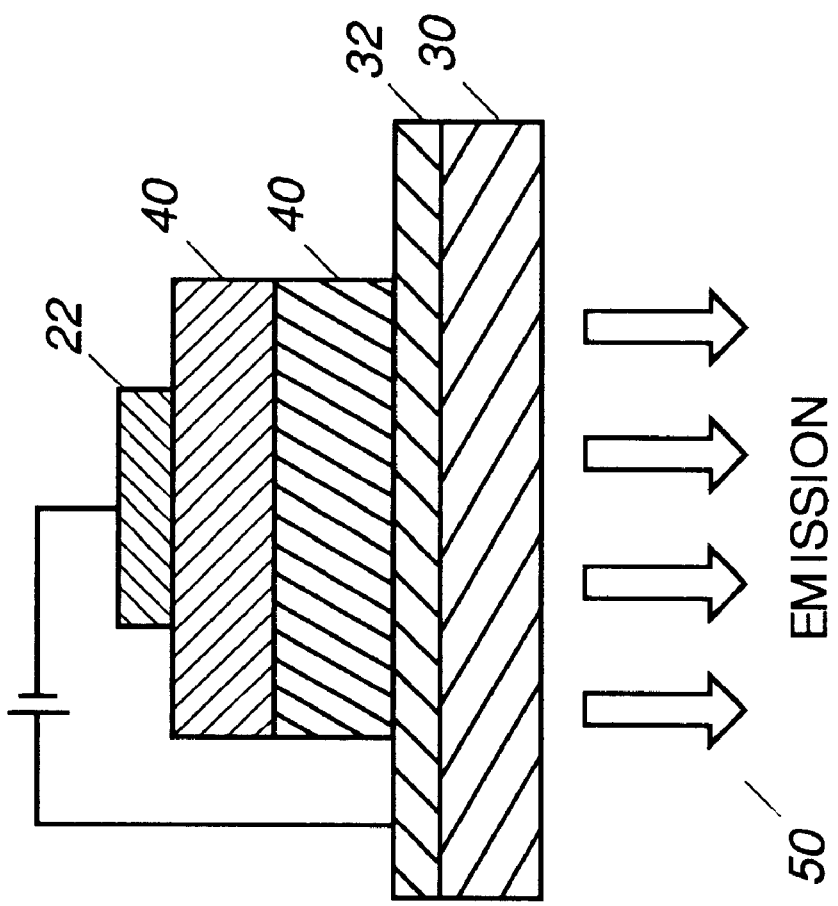
FIG. 4 is a schematic representation of the operation of an active matrix display in accordance with the invention.

The active matrix display of the instant invention now has one or more layers of organic electroluminescent polymers sandwiched between the bottom substrate 20 and the transparent top substrate 30. Referring now to FIG. 4, electrons are injected by the transparent conductor 32 (typically ITO) into the organic electron transport layer 40, and holes are injected into the organic hole transport layer 40 by the contact metal 22. In the preferred embodiment, the contact metal 22 is equivalent to the pixels defined on the bottom substrate. Holes and electrons recombine in an emitting layer, creating other entities which decay with the emission of light 50. With proper choice of materials, light emission begins at about 2 volts. When the individual pixels are selectively energized by a signal from an external display driver, a portion of the organic electroluminescent medium corresponding only to the pixel emits light 50 through the transparent substrate 30, thus creating an active matrix display. The fast switching speeds (typically a few nanoseconds) of organic electroluminescent displays allow them to be easily addressed by active matrix technology. The ITO is typically used as the anode because it is a transparent conductor and its work function is higher than that of the cathode materials. The hole transport layer is typically a high temperature aromatic amine and the electron transport layer is typically a fluorescent organometallic compound.

In summary, an active matrix organic electroluminescent display has been created that utilizes high speed switching and the emissive properties of electroluminescent polymers to create a low cost, high speed display. Problems due to line loss and switching speeds with conventional displays have been eliminated by locating the switching means in close proximity to the individual pixels. The use of transistors or transistor arrays significantly reduces the cost of fabrication of the bottom substrate, in that semiconductor materials are no longer required and fine line semiconductor lithography is not needed. Since the display operates in an emissive or reflective mode the bottom substrate does not need to be transparent, thus more electrically conductive metal systems such as copper, silver, or aluminum may be used in place of the highly resistive ITO. Placing the transistors directly on the substrate increases yield and lowers the cost of the substrate, and line loss associated with running the signal through highly resistive conductive traces is minimized. Conductive via technology allows the transistors to be directly connected to the respective pixels. In short, the response of the instant display is similar to or better than conventional thin film transistor technologies currently used in active matrix displays. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

We claim:

1. A directly addressed display that is operable either in reflective or emissive modes, comprising:

a first substrate having first and second major opposing surfaces, a plurality of pixel elements disposed on the first surface and a plurality of switching means disposed on the second surface, each of the plurality of switching means electrically connected to a respective one of the plurality of pixel elements by a conductive via;

the first substrate also having conductive circuit paths on the second surface, each of the switching means electrically connected to the conductive circuit paths;

an organic electroluminescent medium;

a second substrate transparent to visible light and having an electrically conductive layer disposed thereon; and the first substrate and the organic electroluminescent medium and the second substrate arranged in a stack to form the directly addressed display, so that the organic electroluminescent medium is situated between the two substrates and in intimate contact with both the electrically conductive layer and the plurality of pixel elements, and so that the plurality of switching means, the conductive circuit paths, and the second surface of the first substrate are all on the exterior of the directly addressed display.

2. The directly addressed display as described in claim 1, wherein the switching means comprises a transistor, a diode or a varistor.

3. The directly addressed display as described in claim 1, wherein the switching means comprises a transistor array die.

4. The directly addressed display as described in claim 3, wherein the transistor array die is flip chip mounted on the second surface of the first substrate.

5. The directly addressed display as described in claim 3, wherein the transistor array die is a plastic package mounted on the exterior of the display.

6. The directly addressed display as described in claim 1, further comprising a display driver mounted on the exterior of the directly addressed display.

7. The directly addressed display as described in claim 1, wherein the electrically conductive layer on the second substrate comprises ITO.

8. The directly addressed display as described in claim 1, wherein the plurality of pixel elements comprises one or more metals selected from the group consisting of copper, aluminum, titanium, silver, tungsten, chrome and nickel.

9. The directly addressed display as described in claim 1, wherein each conductive via is filled with copper, solder or tungsten.

10. The directly addressed display as described in claim 1, wherein each conductive via is located within the boundary of the respective pixel element.

11. The directly addressed display as described in claim 1, wherein the first substrate comprises polytetrafluoroethylene, liquid crystal polymer or ceramic.

12. The directly addressed display as described in claim 1, wherein the first substrate is not transparent to visible light.

* * * * *